(12) United States Patent  
Macours et al.

(10) Patent No.: US 11,490,196 B2  
(45) Date of Patent: Nov. 1, 2022

(54) PEAK CURRENT LIMITER

(71) Applicant: GOODIX TECHNOLOGY (HK) COMPANY LIMITED, Hong Kong (HK)

(72) Inventors: Christophe Marc Macours, Redhill (GB); Geraldine Vignon, Redhill (GB); Johan Laneau, Redhill (GB)

(73) Assignee: GOODIX TECHNOLOGY (HK) COMPANY LIMITED, Hong Kong (HK)

( * ) Notice: Subject to any disclaimer, the term of this patent is extended or adjusted under 35 U.S.C. 154(b) by 39 days.

(21) Appl. No.: 17/139,902

(22) Filed: Dec. 31, 2020

(65) Prior Publication Data

US 2021/0127203 A1 Apr. 29, 2021

Related U.S. Application Data

(63) Continuation of application No. PCT/CN2020/084765, filed on Apr. 14, 2020.

(30) Foreign Application Priority Data

Apr. 17, 2019 (EP) .................................... 19305500

(51) Int. Cl.
*H04R 3/00* (2006.01)
*H03F 1/02* (2006.01)
(Continued)

(52) U.S. Cl.
CPC ................. *H04R 3/00* (2013.01); *H03F 1/02* (2013.01); *H03F 3/183* (2013.01); *H03F 3/21* (2013.01);
(Continued)

(58) Field of Classification Search
CPC .. H04R 3/00; H04R 2420/01; H04R 2499/11; H03F 1/02; H03F 3/183; H03F 3/21; H03F 3/68; H03F 2200/03; H03F 1/3282
(Continued)

(56) References Cited

U.S. PATENT DOCUMENTS 5,200,708 A 4/1993 Morris, Jr. et al.
9,600,052 B2 3/2017 Persson et al.
(Continued)

FOREIGN PATENT DOCUMENTS

CN 107407957 A 11/2017
CN 108206628 A 6/2018
GB 2260233 A 4/1993

*Primary Examiner* — Vivian C Chin
*Assistant Examiner* — Friedrich Fahnert
(74) *Attorney, Agent, or Firm* — Scully Scott Murphy & Presser (57) ABSTRACT

A peak current limiter for an audio system comprising at least two audio amplifiers is described. The peak current limiter comprises at least two audio inputs; at least two audio outputs, each audio output being coupled to a respective one of the at least two audio inputs and configured to be coupled to a respective one of the at least two audio amplifiers. The peak current limiter is configured to receive an audio signal on each of the respective audio inputs. The peak current limiter determines a current value required by each of at least two audio amplifiers. An audio characteristic of at least one of the received audio signals is modified to limit the total current supplied to the at least two amplifiers below a predefined maximum current value.

19 Claims, 6 Drawing Sheets

(51) Int. Cl.
    *H03F 3/183*     (2006.01)
    *H03F 3/21*     (2006.01)
    *H03F 3/68*     (2006.01)

(52) U.S. Cl.
    CPC ........... *H03F 3/68* (2013.01); *H03F 2200/03* (2013.01); *H04R 2420/01* (2013.01); *H04R 2499/11* (2013.01)

(58) Field of Classification Search
    USPC ........................................................ 381/107
    See application file for complete search history.

(56) References Cited

U.S. PATENT DOCUMENTS

| | | |
|---|---|---|
| 9,947,186 B2 | 4/2018 | Macours |
| 10,008,933 B1 | 6/2018 | Leong |
| 10,326,367 B2 | 6/2019 | Leong |
| 10,622,892 B2 | 4/2020 | Leong |
| 2008/0025530 A1 | 1/2008 | Romesburg |
| 2014/0301570 A1 | 10/2014 | Morriss et al. |
| 2015/0270810 A1 | 9/2015 | Martin et al. |
| 2016/0126899 A1* | 5/2016 | Doy ........................ H03F 3/68 330/297 |
| 2016/0274640 A1 | 9/2016 | Persson et al. |
| 2017/0040895 A1 | 2/2017 | May et al. |
| 2017/0169674 A1 | 6/2017 | Macours |
| 2018/0175730 A1 | 6/2018 | Leong |
| 2018/0294722 A1 | 10/2018 | Leong |
| 2019/0267899 A1 | 8/2019 | Leong |

\* cited by examiner

PEAK CURRENT LIMITER

CROSS-REFERENCE TO RELATED APPLICATIONS

This application is a continuation of International Application No. PCT/CN2020/084765, filed on Apr. 14, 2020, which claims priority to EP Patent Application No. 19305500.1 entitled "PEAK CURRENT LIMITER" filed on Apr. 17, 2019. The disclosures of the aforementioned applications are hereby incorporated by reference in their entireties.

FIELD

This disclosure relates to peak current limiter for an audio apparatus.

BACKGROUND

Smart audio amplifiers are used in mobile devices and other devices including audio systems which may have relatively low-power power supplies available. These devices may be for example battery-powered devices such as mobile phones. Mobile phone batteries have limited capability to deliver very large peak currents.

The audio systems in mobile phones may have more than one channel resulting in peak current demand which may exceed the available supply current. The audio amplifier(s) are becoming the main contributor to the peak currents. If other resources in the phone have significant current requirement peak currents the total battery peak current can become too high.

Moreover, additional components such as haptic drivers, may require large peak currents for a limited period of time to reproduce sharp and strong haptic vibrations through the haptic actuator.

SUMMARY

Various aspects of the disclosure are defined in the accompanying claims. In a first aspect there is provided a peak current limiter for an audio system comprising at least two audio amplifiers, the peak current limiter comprising: at least two audio inputs; at least two audio outputs, each audio output being coupled to a respective one of the at least two audio inputs and configured to be coupled to a respective one of the at least two audio amplifiers; wherein the peak current limiter is configured to receive an audio signal on each of the respective audio inputs; determine a current value for each of the at least two audio amplifiers; and modify an audio characteristic of at least one of the received audio signals to limit the total current supplied to the at least two amplifiers below a predefined maximum current value.

In one or more embodiments, the peak current limiter may further comprise a plurality of sensor inputs configured to be coupled to each respective amplifier; wherein the peak current limiter is configured to determine a current value for each of the at least two audio amplifiers from a signal received on the respective sensor input.

In one or more embodiments, the peak current limiter may be further configured to determine a current value for each of the at least two audio amplifiers from the respective received audio signal and a model of the respective audio amplifier.

In one or more embodiments, the peak current limiter may further comprise a controller and a processor, wherein the processor is configured to receive the at least two audio signals on a respective audio input and output the processed audio signals on the respective audio output; and the controller is configured to determine the first current and the second current value corresponding to a current in the first and second audio amplifiers; and in response to the sum of the first current value and the second current value exceeding a predefined maximum to control the processor to modify an audio characteristic of at least one of the first audio signal and the second audio signal to reduce the total current.

In one or more embodiments, the processor may comprise a gain stage arranged between each audio input and audio output; wherein the controller has a control output coupled to each gain stage.

In one or more embodiments, the controller may be configured to determine the target gain for each gain stage from the square root of the ratio of the sum of the current values and the predefined maximum current value.

In one or more embodiments, the processor may comprise a first phase shifter arranged between a first audio input and a first audio output and a second phase shifter arranged between a second audio input and a second audio output; wherein the controller has a first control output coupled to the first phase shifter and a second control output coupled to the second phase shifter.

In one or more embodiments, the controller may be configured to control the first and second phase shifters to only apply a phase shift to audio frequency components above a predetermined frequency.

In one or more embodiments, the processor may comprise: a first mixer having a first input coupled to the output of the first phase shifter, a second input coupled to the first audio input, and a mixer output coupled to the first audio output, a second mixer having a first input coupled to the output of the second phase shifter, a second input coupled to the second audio input, and a mixer output coupled to the second audio output; wherein the controller is further configured to control the first mixer and the second mixer to vary the mixing level dependent on the determined first and second current values and wherein the difference in phase applied by the first phase shifter and the second phase shifter is approximately 90 degrees.

In one or more embodiments, the controller may be configured to determine the mixing level for the first mixer and the second mixer by determining the sum of the squares of the first audio signal and the second audio signal.

Embodiments of the peak current limiter may be included in an audio apparatus further comprising a power amplifier coupled to each of the at least two audio outputs.

In a second aspect there is described a method of peak current limiting for an audio system comprising at least two audio amplifiers coupled to a respective audio input, the method comprising: receiving an audio signal on each of the respective audio inputs; determining a current value for each of the at least two audio amplifiers; modifying an audio characteristic of at least one of the received audio signals to limit the total current supplied to the at least two amplifiers below a predefined maximum current value.

In one or more embodiments, modifying the audio characteristic may comprise at least one of varying an amplitude and a phase of at least one of the received audio signals.

In one or more embodiments, varying the amplitude may comprise applying a gain factor to at least one of the received audio signals determined from the square root of the ratio of the sum of the current values and the predefined maximum current value.

In one or more embodiments, the method may further comprise receiving a first audio signal on a first audio input, receiving a second audio signal on a second audio input, varying the phase of at least one of the first audio signal and the second audio signal such that the difference in phase between the first audio signal and the second audio signal is approximately 90 degrees.

In a third aspect there is described a computer program product for peak current limiting in an audio system comprising at least two audio amplifiers coupled to a respective audio input, the computer program product comprising instructions which, when being executed by a processing unit, cause said processing unit to perform the steps of receiving an audio signal on each of the respective audio inputs; determining a current value for each of the at least two audio amplifiers; modifying an audio characteristic of at least one of the received audio signals to limit the total current supplied to the at least two amplifiers below a predefined maximum current value.

BRIEF DESCRIPTION OF THE DRAWINGS

In the figures and description like reference numerals refer to like features. Embodiments of are now described in detail, by way of example only, illustrated by the accompanying drawings in which.

DETAILED DESCRIPTION

Figures 1, 2:
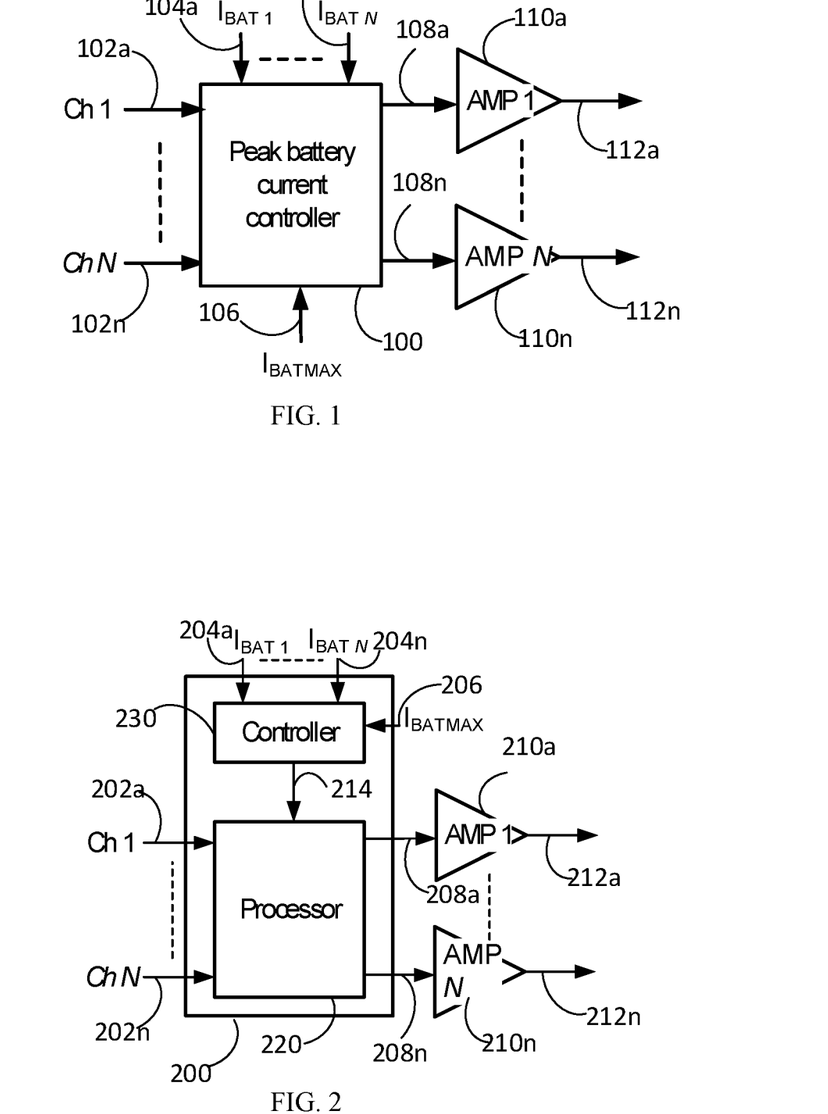
FIG. 1 shows an audio system including peak current limiter according to an embodiment.
FIG. 2 illustrates an audio system including a peak current limiter according to an embodiment.

FIG. 1 shows an audio system including a peak current limiter 100 and a number (N) of power amplifiers 110a to 110n where N>1. The peak current limiter 100 may have N audio channel inputs 102a to 102n. The peak current limiter 100 may have N corresponding audio channel outputs 108a to 108n. The peak current limiter 100 may have N current sensor inputs 104a to 104n. The peak current limiter 100 may have a maximum current value input 106.

In operation, the peak current limiter outputs 108a to 108n may be connected to respective power amplifiers 110a to 110n. In this example as described the audio system may be supplied by a battery. It will be appreciated that in other examples, the power source may be derived from other power sources including but not limited to mains power, or a super capacitor, or solar cell. The respective amplifier outputs 112a to 112n may be connected to respective acoustic transducers (not shown) which may be loudspeakers or haptic actuators. The current sensor inputs 104a to 104n may be connected (not shown) to the respective amplifiers 112a to 112n. The peak current limiter 100 may jointly process the N input channels based on the N current sensor inputs 104a to 104n and output a corresponding processed signal in each of the N audio output channels 108a to 108n such that the total current ($I_{BAT1}+\ldots+I_{BATN}$) does not exceed a maximum value ($I_{BATMAX}$) received on the maximum current value input 106.

In some examples, the value of $I_{BATMAX}$ may be predetermined and fixed. In other examples, the value of $I_{BATMAX}$ may be dynamically determined from the difference between the maximum possible current supplied for example by a battery or other power source and the current required by the remainder of the audio system excluding the amplifiers. Dynamically determining the maximum current value may ensure that the battery voltage does not drop below a predefined minimum value $V_{BATMIN}$. This processing of the N input channels for example may include modifying a characteristic of one or more of the audio signals. This may include for example varying the gain and/or phase of one or more of the audio signals received on the respective audio input channels 102a to 102n. In some examples, the current sensor inputs 104a to 104n may not directly measure the current but may derive the current value by detecting the supply voltage which may be a battery voltage. For example, a battery voltage $V_{BAT}$ drops dependent on the battery current ($I_{BAT}$). Knowing the source impedance of the battery ($Re_{BAT}$), it is therefore possible to estimate $I_{BAT}$ from $V_{BAT}$ and $Re_{BAT}$.

The inventors of the present disclosure have appreciated that for multi-channel audio systems where the available power is limited, for example battery powered systems, peak battery current limits of the power amplifiers based on their individual peak current consumption may be dynamically allocated. This may allow the performance of the audio system to be improved by maximizing the output of the individual power amplifiers while staying within the maximum current budget of the battery or other supply source. In typical single-channel solutions, each amplifier has its own peak current limit. In case of an N-channel system, each amplifier would typically get a peak current limit equal to 1/Nth of the total peak current budget. This method works if all N devices are drawing the same amount of peak current, which typically is the case when the signals are the same, such as in a stereo device where both left and right signals are identical (mono).

In case of different audio and/or haptic signals, this approach results in suboptimal results. Taking the simple stereo example where there is no signal on one of the channels, the other channel would then be limited to half of the total peak current budget, while it could benefit from the total peak current budget.

FIG. 2 shows an audio system including a peak current limiter 200 and a number (N) of power amplifiers 210a to 210n where N>1. The peak current limiter 200 may have a controller 230 and a processor 220. The peak current limiter 200 may have N audio channel inputs 202a to 202n, where N>1 connected to the processor 220. The peak current limiter 200 may have N corresponding audio channel outputs 208a to 208n connected to respective outputs of the processor 220. The peak current limiter 200 may have N current sensor inputs 204a to 204n connected to respective inputs of the controller 230. The peak current limiter 200 may have a maximum current value input 206 connected to an input of the controller 230. The controller 230 may have a control output 214 connected to the processor 220.

In operation, the peak current limiter outputs 208a to 208n may be connected to respective power amplifiers 210a to 210n. The respective amplifier outputs 212a to 212n may be connected to respective acoustic transducers (not shown) which may be loudspeakers or haptic actuators. The current sensor inputs 204a to 204n may be connected to the respective amplifiers 212a to 212n. The processor 220 may process the N input channels based on the N current sensor inputs 204a to 204n and output a corresponding processed signal in each of the N audio output channels 208a to 208n. In other examples, the processor may be connected to the audio input channels 202a to 202n and estimate the current from the audio input signals and a model of the amplifiers 210a to 201n. In this case the current sensor inputs 204a to 204n may be omitted.

The controller 230 may control the processor 220 via the control output 214 such that the total current, corresponding to the sum of the battery currents $I_{BAT1}+\ldots+I_{BATN}$ required by the amplifiers 210a to 210n does not exceed a maximum value $I_{BATMAX}$ received on the maximum current value input 206. The control output 214 may for example output a control signal including a gain value, and a phase shift value. The processor 220 may process the audio signal received on one or more of the channels 202a to 202n by modifying at least one characteristic. Modifying an audio characteristic may for example include varying the gain and/or phase of one or more of the audio signal received on the respective audio input channels 202a to 202n. The controller 230 may determine a current value for the amplifiers from current sensor inputs 204a to 204n. In other examples the controller 230 may be connected to the audio channel inputs 202a to 202n and estimate an amplifier current for each of the amplifiers 210a to 210n from the respective audio signal received on the 202a to 202n using a model of the respective amplifiers 210a to 210n. The amplifiers 210a to 210n may be identical or different.

Figure 3:
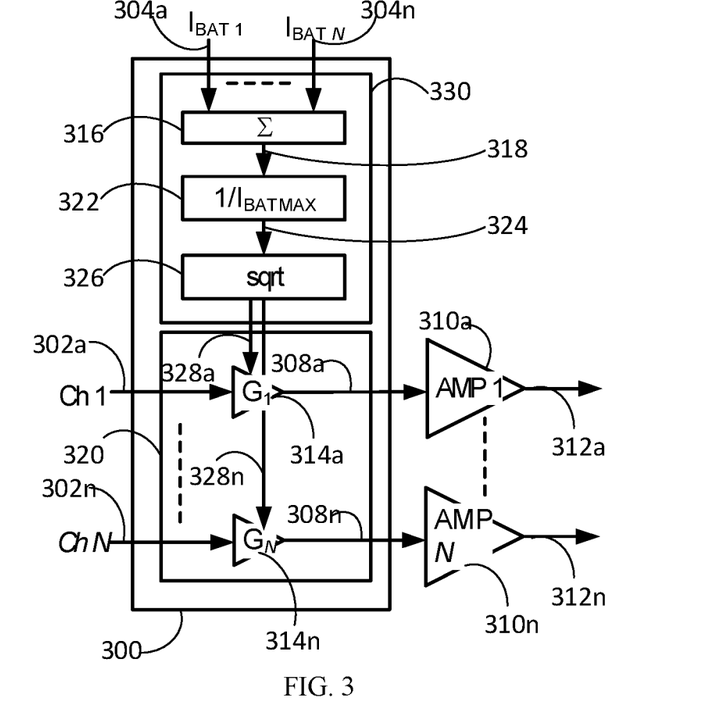
FIG. 3 shows an audio system including a peak current limiter according to an embodiment.

FIG. 3 shows an audio system including a peak current limiter 300 and a number (N) of power amplifiers 310a to 310n where N>1. The peak current limiter 300 may have a controller 330 and a processor 320. The controller 330 may include an adder 316 which may have N inputs connected to current sensor inputs 304a to 304n. The adder output 318 may be connected to a divider module 322. The divider output 324 may be connected to an arithmetic unit 326. The arithmetic unit may have N outputs connected to controller outputs 328a to 328n.

The processor 320 may have N gain stages 314a to 314n. The peak current limiter 300 may have N audio channel inputs 302a to 302n, where N>1 connected to a respective input of each of the gain stages 314a to 314n. The peak current limiter 300 may have N corresponding audio channel outputs 308a to 308n connected to respective outputs of each of the gain stages 314a to 314n. The controller outputs 328a to 328n may be connected to respective control inputs of each of the gain stages 314a to 314n.

In operation, the peak current limiter outputs 308a to 308n may be connected to respective power amplifiers 310a to 310n. The respective amplifier outputs 312a to 312n may be connected to respective acoustic transducers (not shown) which may be loudspeakers or haptic actuators. The current sensor inputs 304a to 304n may be connected to the respective amplifier outputs 312a to 312n. The adder 316 may determine the total current from each of the detected current values on sensor inputs 304a to 304n. The divider module 322 may determine the ratio of the total current and the maximum current value. The arithmetic unit 326 may determine the target gain applied to the gain stages 314a to 314n from the square root of the ratio of the total current and the maximum current value. It will be appreciated that the gain value required is related to the inverse of this result. The controller 330 may apply the determined gain values to each of the gain stages 314a to 314n.

In this way the gain applied dynamically varies to maximise the power available for each particular channel. For example, if a signal is only present on a first channel 302a, only amplifier 310a will draw current and so the gain factor applied will be higher than if multiple channels have an active input signal. Typically, the gains applied by the controller 320 may be the same for all channels. In some examples, the gains applied by the controller 320 may be different from one channel to the other in order to allow for example duty cycling between the channels or channel prioritization. The controller 320 may apply different gains by applying a weighting factor could be applied to the gain for each channel. The gains may be frequency dependent in order to account for the typical frequency dependency of electrodynamic transducers such as loudspeakers and linear resonant actuator (LRAs). The gain applied by the gain stages 314a to 314n may be smoothed and/or saturated within a pre-defined interval to prevent abrupt variations and excessive gain.

Figure 4:
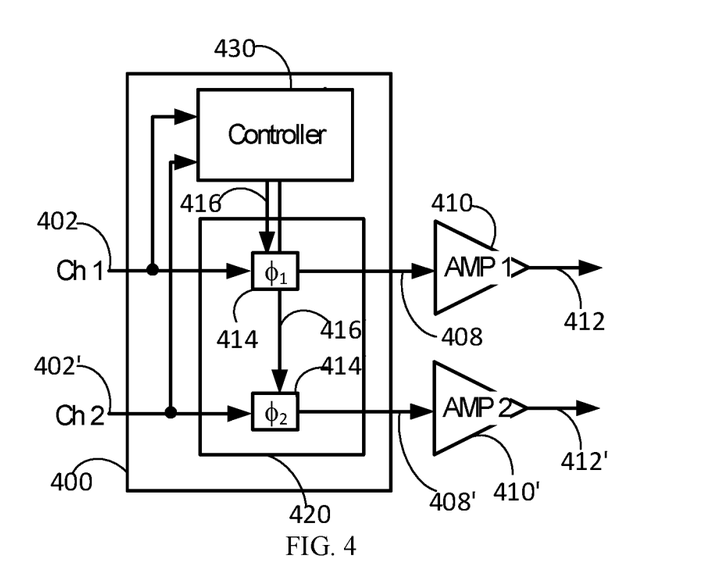
FIG. 4 illustrates an audio system including a peak current limiter according to an embodiment.

FIG. 4 shows a two-channel audio system including a peak current limiter 400 and two power amplifiers 410, 410'. The peak current limiter 400 may have a controller 430 and a processor 420. The processor 420 may have two phase shifters 414, 414'. The peak current limiter 400 may have a first audio channel input 402 connected to an input of first phase shifter 414. The peak current limiter 400 may have a first audio channel output 408 connected to an output of the first phase shifter 414. The peak current limiter 400 may have a second audio channel output 408' connected to an output of second phase shifter 414'. The controller 430 may have a first control input connected to the first audio input channel 402. The controller 430 may have a second control input connected to a second audio input channel 402'. The controller 430 may have a first control output 416 connected to a control input of the first phase shifter 414. The controller 430 may have a second control output 416' connected to a control input of the second phase shifter 414'.

In operation of the peak current limiter 400, the first audio channel output 408 may be connected to an input of first audio power amplifier 410, the second audio channel output 408' may be connected to an input of second audio power amplifier 410'. The amplifier outputs 412, 412' may be connected to respective acoustic transducers (not shown) which may be loudspeakers or haptic actuators.

The controller 430 may determine an estimate of the current supplied or required to first amplifier 410 and the second amplifier 410' from the respective audio signal received on the first audio input channel 402 and the second audio input channel 402' using a model of the respective first amplifier 410 and second amplifier 410'. The controller 430 may determine a required phase shift φ1 to be applied by the first phase shifter 414 and a phase shift φ2 to be applied by the second phase shifter 414' from the current estimates and a maximum current value. In some examples the maximum current value may be predetermined and fixed. In other examples, the maximum current value may be dynamically calculated by detecting the current drawn by the rest of the audio system excluding the power amplifiers 410,410'. In other examples, the maximum current value may be determined dynamically by detecting the current drawn from a system including the peak current limiter but excluding the audio amplifier 410,410'.

It will be appreciated that adjusting the phase of the signals such that the phase difference between the output signal on first audio channel output 408 and the output signal on second audio channel output 408' is 90 degrees, that is to say the signals are in quadrature phase, typically results in a reduction of the current required by a factor of 2. However, doing so in case of audio signals results in a destructive acoustical interference resulting in a 3 dB loss at low frequencies. In order to reduce the peak current while maintaining the same acoustical response at low frequencies, the phase shift needs to be applied conditionally, that is only above a predetermined frequency, to prevent destructive acoustical interference at low frequencies which may be for example frequencies below 1000 Hz.

The phase shifters 414, 414' may be implemented for example using time-domain all-pass Infinite Impulse Response (IIR) or Finite Impulse Response (FIR) filters. In other examples the phase shifters 414,414' may be implemented in the frequency domain using a short-time discrete Fourier transform (DFT).

In some examples, the phase shifters 414,414' may adjust the phase such that the phase difference between the output signal on first audio channel output 408 and the output signal on second audio channel output 408' is in a range of 90 degrees+/−45 degrees to reduce the peak current.

Figure 5:
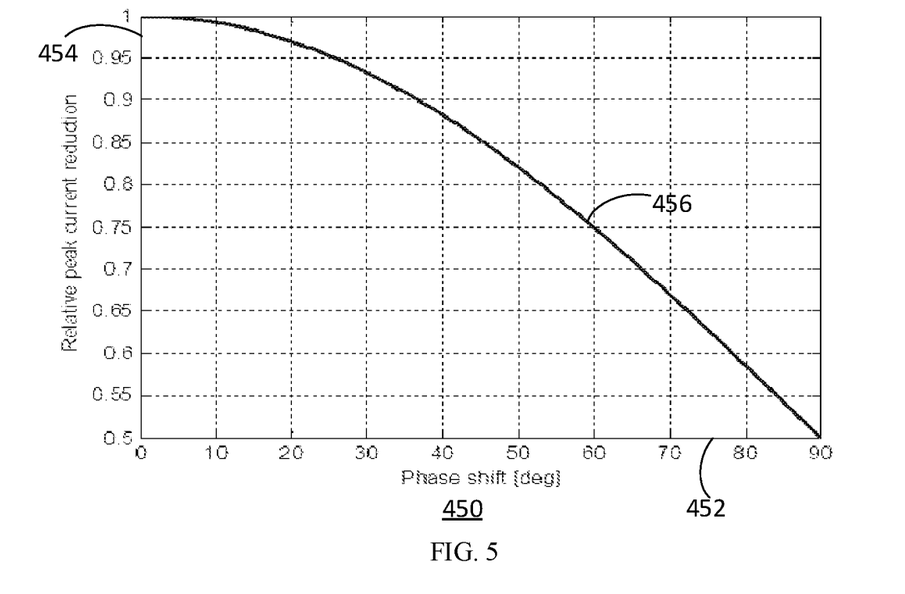
FIG. 5 shows a graph illustrating the variation in peak current dependent on the phase shift of the audio signals.

This effect of phase shifting the audio signals on peak current is illustrated in FIG. 5. FIG. 5 shows a graph 450 of the relative reduction in peak current on the y-axis 454 dependent on the phase difference on the x-axis 452. The line 456 indicates at 0 degrees phase shift, there is no reduction in peak current. At 45 degrees phase shift, there is a 15% reduction in peak current. At 60 degrees phase shift there is a 25% reduction in the peak current. At 90 degrees phase shift, there is a 50% reduction in peak current.

Figure 6:
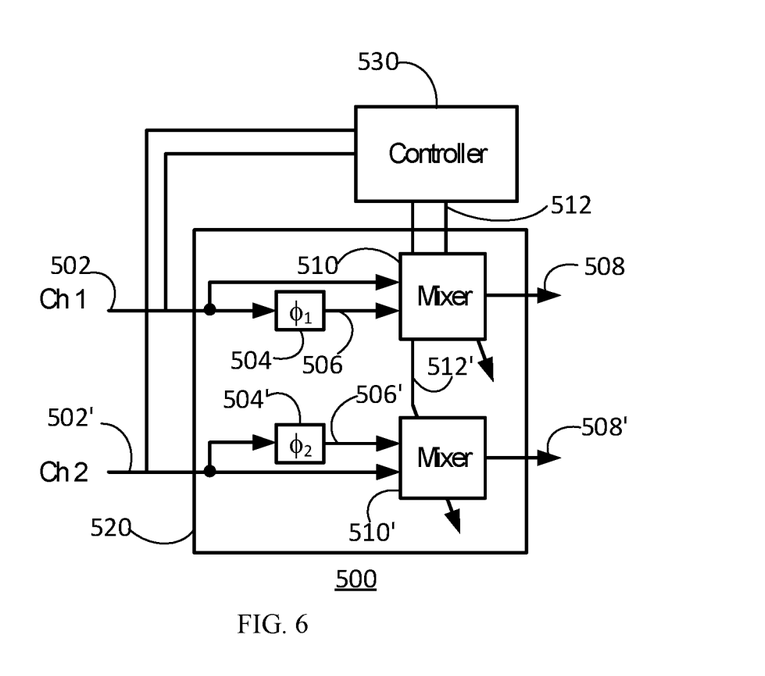
FIG. 6 shows a peak current limiter according to an embodiment.

FIG. 6 shows a peak current limiter 500. The peak current limiter 500 may have a controller 530 and a processor 520. The processor 520 may have two phase shifters 504, 504' and two mixers 510, 510'. The peak current limiter 500 may have a first audio channel input 502 connected to an input of first phase shifter 504. The first phase shifter output 506 may be connected to a first input of the first mixer 510. A second input of the first mixer 510 may be connected to the first audio channel input 502. The peak current limiter 500 may have a first audio channel output 508 connected to an output of the first mixer 510. The peak current limiter 500 may have a second audio channel input 502' connected to an input of second phase shifter 504'. The first phase shifter output 506' may be connected to a first input of the second mixer 510'. A second input of the second mixer 510' may be connected to the second audio channel input 502'. The peak current limiter 500 may have a second audio channel output 508' connected to an output of the second mixer 510'. The controller 530 may have a first control input connected to the first audio input channel 502. The controller 530 may have a second control input connected to a second audio input channel 502'. The controller 530 may have a first control output 512 connected to a control input of the first phase shifter 514. The controller 530 may have a second control output 512' connected to a control input of the second phase shifter 514'.

In operation of the peak current limiter 500, the first audio channel output 508 may be connected to an input of first audio power amplifier (not shown), the second audio channel output 508' may be connected to an input of second audio power amplifier (not shown). The first and second amplifiers may be connected to respective acoustic transducers (not shown) which may be loudspeakers or haptic actuators.

The controller 530 may determine an estimate of the current supplied or required to the first amplifier and the second amplifier from the respective audio signal received on the first audio input channel 502 and the second audio input channel 502' and a model of the respective amplifier 510, 510'. The controller 530 may determine a required phase shift $\phi1$ to be applied by the first phase shifter 504 and a phase shift $\phi2$ to be applied by the second phase shifter 504' from the current estimates and a maximum current value. The controller 530 may always apply a phase shift value such that the difference between the phase shifts, that is to say $\phi2-\phi1$, is always approximately 90 degrees. It will be appreciated that a phase shift of 90 degrees may give the optimal result but in practice the exact phase shift may be approximately 90 degrees which may be considered to vary for example in a range of 90 degrees+/−10 degrees. In some examples the maximum current value may be predetermined and fixed. In other examples, the maximum current value may be dynamically calculated detecting the current drawn by the rest of the audio system excluding the power amplifiers.

The controller 530 may determine the mixing factor to be applied between the original signals and the quadrature phase shifted signals based on the input signal.

An example metric to determine the mixing level between the original and the phase shifted signals is the squared sum of the signals $ss(t)=|ch1(t)|^2+|ch2(t)|^2$. Where $ch1(t)$ is the signal received on the first audio input channel 502 and $ch2(t)$ is the signal received on the second audio input channel 502'. Since the total current which may for example by supplied by a battery is known to be proportional to the sum of the squares of the signals, any reduction of $ss(t)$ will be reflected accordingly in the total current.

Taking the example of a sinewave signal, $$ch1(t)=\cos(\omega t)$$

$$ch2(t)=\cos(\omega+\phi), \text{ where } \phi=\phi2-\phi1$$

When $\phi=0$, $ss(t)=|ch1(t)|^2+|ch2(t)|^2=2\cos^2(\omega t)$. The peak value is 2.

When $\phi=\pi/2$, $ss(t)=|ch1(t)|^2+|ch2(t)|^2=\cos^2(\omega t)+\sin^2(\omega t)=1$. The peak value is 1 and reduced by a factor of 2. This is the best-case reduction that can be expected by quadrature phase shifting.

The same reasoning can be applied to broadband signals (with peak value of 1):

$ss(t)=2$ when both signals reach their full-scale value at the same time. At that moment the effect of the 90 degrees phase shifting will be a maximum and the mixer may output the phase shifted signal.

$ss(t)<=1$ or less means that the input signals are such that $ss(t)$ is already below the best case that can be obtained when $ss(t)=2$. Applying the phase shift may actually increase $ss(t)$ when for example the input signals are already phase shifted by 90 degrees. In this case ($ss(t)<=1$), the controller 530 controls the first mixer 510 and the second mixer 510' to output the original non-phase-shifted input signals.

When $ss(t)$ has a value between 1 and 2, the controller 530 may control the first mixer 510 and the second mixer 510' to gradually transition the signal on each of the audio channel outputs from original to phase shifted inputs.

Figure 7:
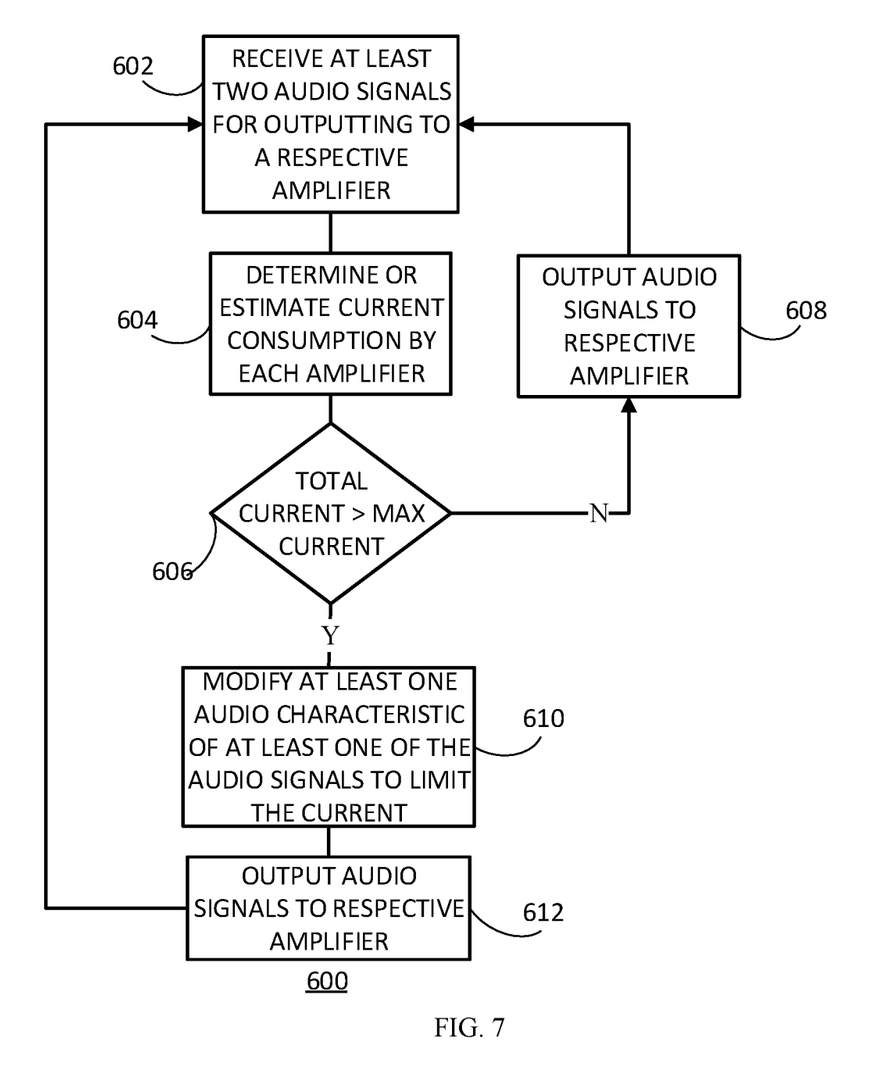
FIG. 7 illustrates a method of peak current limiting according to an embodiment.

FIG. 7 shows a method of peak current limiting for an audio system 600 according to an embodiment. In step 602 at least two audio signals may be received on respective channels for outputting to a respective audio amplifier. The audio amplifier may for example be a class D amplifier. In step 604 a current consumption may be determined or estimated for each amplifier. In step 606, the method may compare the total current consumption estimated or determined for all the amplifiers with an expected maximum current value. This maximum current value may be predetermined and fixed or estimated from a current measurement of the circuitry excluding the power amplifiers or audio amplifiers and the maximum power available from the power source may for example be a battery.

If the total current exceeds the maximum available current, then in step 610 at least one audio characteristic of at least one of the audio signals may be modified in order to limit the current consumption below the maximum current value. The audio characteristic that may be modified may for example be the amplitude or phase. The method 600 then moves to step 612 and the output audio signals may be transmitted to the respective amplifier, including any audio signals with the modified audio characteristics. The method then returns to step 602. Returning to step 606, if the total current is less than the maximum available current, then the method moves to step 608 and the output audio signals may be output to the respective amplifier without any further modification. The method then returns to step 602. Method 600 may be implemented in hardware, or by software running on a microprocessor, microcontroller, or digital signal processor.

Figure 8:
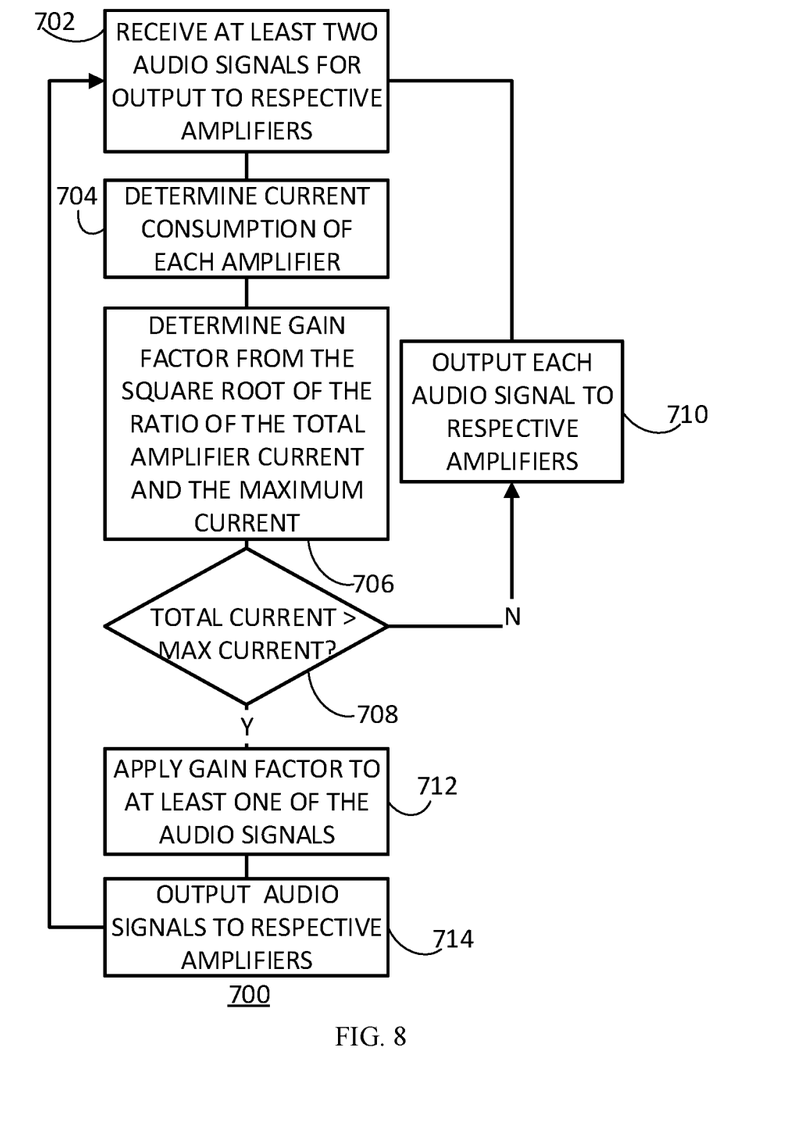
FIG. 8 shows a method of peak current limiting according to an embodiment.

FIG. 8 shows a method of peak current limiting for an audio system 700. In step 702, at least two audio signals may be received on respective audio input channels for outputting to a respective audio amplifier. In step 704 a current consumption may be determined for each amplifier. In step 706 a gain factor to be applied to each amplifier may be determined from the square root of the ratio of the total amplifier current and a maximum current. It will be appreciated that the gain factor is related to the inverse of this ratio. In step 708 the method 700 may compare the total current with the maximum available current. If the total current consumed by the amplifiers exceeds the maximum available current, the method moves to step 712 and a gain factor determined in step 706 is applied to at least one of the audio signals. The method then moves to step 714 and the audio signals are output to the respective amplifiers. The method then returns to step 702. Returning to step 708, if the total current does not exceed the maximum available current, the method then moves to step 710 and the audio signal on each channel is output to a respective amplifier. The method then returns to step 702. Method 700 may be implemented in hardware, or by software running on a microprocessor, microcontroller, or digital signal processor.

Figure 9:
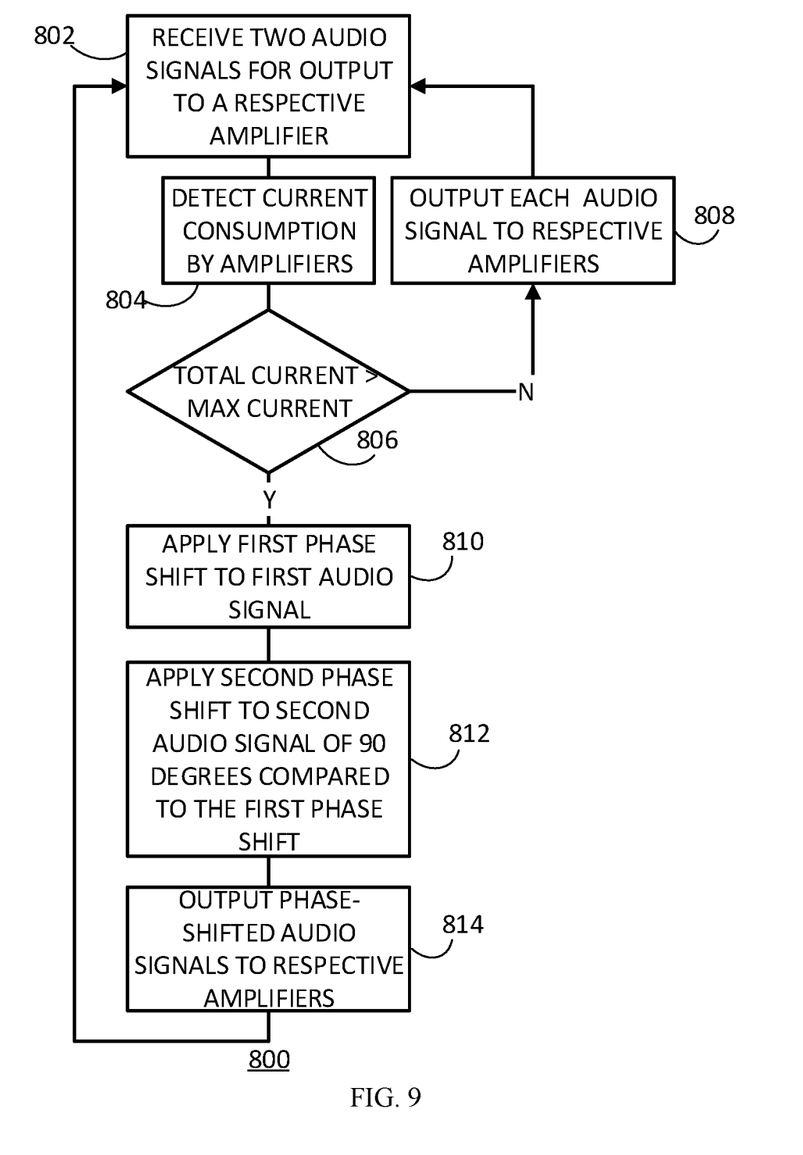
FIG. 9 illustrates a method of peak current limiting according to an embodiment.

FIG. 9 shows a method of peak current limiting for an audio system 800. In step 802, two audio signals may be received on respective audio input channels for outputting to a respective audio amplifier. In step 804 a current consumption may be determined for each amplifier. In step 806 the method 800 may compare the total current with the maximum available current. If the total current exceeds the maximum available current, then in step 810, a first phase shift may be applied to a first audio signal. In step 812, a second phase shift may be applied to a second audio signal which has a difference of 90° when compared to the first phase shift. In step 814 the phase-shifted audio signals may be output to the respective amplifiers. The method then returns to step 802. Returning to step 806, if the total current is less than the maximum available current, the method moves to step 808 and each of the first and second audio signals are output to the respective amplifiers. The method then returns to step 802. Method 800 may be implemented in hardware, or by software running on a microprocessor, microcontroller, or digital signal processor.

Embodiments describe a system and method for dynamically allocating the peak battery current limits of two or more power amplifiers based on their instantaneous individual peak current consumption. This makes it possible to continuously maximize the output performance of the individual power amplifiers while staying within the total battery current budget. Power amplifiers can equally be audio as well as haptic amplifiers.

A peak current limiter for an audio system comprising at least two audio amplifiers is described. The peak current limiter comprises at least two audio inputs; at least two audio outputs, each audio output being coupled to a respective one of the at least two audio inputs and configured to be coupled to a respective one of the at least two audio amplifiers. The peak current limiter is configured to receive an audio signal on each of the respective audio inputs. The peak current limiter determines a current value required by each of at least two audio amplifiers. An audio characteristic of at least one of the received audio signals is modified to limit the total current supplied to the at least two amplifiers below a predefined maximum current value.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

In some example embodiments the set of instructions/method steps described above are implemented as functional and software instructions embodied as a set of executable instructions on a non-transitory machine-readable storage medium which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components. The non-transitory machine-readable storage medium may include volatile and non-volatile memories such as read only memory (ROM), random access memory (RAM), magnetic disk storage media, optical storage medium, flash memory, and the like. The non-transitory machine-readable storage medium excludes transitory signals.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

What is claimed is:

1. A peak current limiter for an audio system comprising at least two audio amplifiers, the peak current limiter comprising:

at least two audio inputs;
at least two audio outputs, each audio output being coupled to a respective one of the at least two audio inputs and configured to be coupled to a respective one of the at least two audio amplifiers;
wherein the peak current limiter is configured to:
receive an audio signal on each of the respective audio inputs;
determine a current value for each of the at least two audio amplifiers; and
modify an audio characteristic of at least one of the received audio signals to limit a total current supplied to the at least two amplifiers below a predefined maximum current value, and
wherein the peak current limiter further comprises a controller and a processor,
wherein the processor is configured to receive the at least two audio signals on a respective audio input and output the processed audio signals on the respective audio output, and
wherein the controller is configured to:
determine a first current value and a second current value corresponding to a current in a first audio amplifier and a second audio amplifier respectively; and
in response to a sum of the first current value and the second current value exceeding a predefined maximum, control the processor to modify an audio characteristic of at least one of a first audio signal and a second audio signal to reduce the total current.

2. The peak current limiter of claim 1 further comprising a plurality of sensor inputs configured to be coupled to each respective amplifier; wherein the peak current limiter is configured to determine a current value for each of the at least two audio amplifiers from a signal received on the respective sensor input.

3. The peak current limiter of claim 1 further configured to determine a current value for each of the at least two audio amplifiers from the respective received audio signal and a model of the respective audio amplifier.

4. The peak current limiter of claim 1 wherein the processor comprises a gain stage arranged between each audio input and audio output; wherein the controller has a control output coupled to each gain stage.

5. The peak current limiter of claim 4 wherein the controller is configured to determine a target gain for each gain stage from a square root of a ratio of a sum of the current values and the predefined maximum current value.

6. The peak current limiter of claim 1 wherein the processor comprises a first phase shifter arranged between a first audio input and a first audio output and a second phase shifter arranged between a second audio input and a second audio output; wherein the controller has a first control output coupled to the first phase shifter and a second control output coupled to the second phase shifter.

7. The peak current limiter of claim 6 wherein the controller is configured to control the first and second phase shifters to only apply a phase shift to audio frequency components above a predetermined frequency.

8. The peak current limiter of claim 6 wherein the phase shifters be implemented using time-domain all-pass Infinite Impulse Response (IIR) or Finite Impulse Response (FIR) filters or be implemented in a frequency domain using a short-time discrete Fourier transform (DFT).

9. The peak current limiter of claim 6 wherein the phase shifters adjust the phase such that a phase difference between the output signal on first audio channel output and the output signal on second audio channel output is in a range of 90 degrees+/−45 degrees to reduce the peak current.

10. The peak current limiter of claim 6 wherein the processor further comprises:
a first mixer having a first input coupled to an output of the first phase shifter; a second input coupled to the first audio input, and a mixer output coupled to the first audio output:
a second mixer having a first input coupled to an output of the second phase shifter, a second input coupled to the second audio input, and a mixer output coupled to the second audio output;
wherein the controller is further configured to control the first mixer and the second mixer to vary a mixing level dependent on the determined first and second current values and wherein a difference in phase applied by the first phase shifter and the second phase shifter is approximately 90 degrees.

11. The peak current limiter of claim 10 wherein the controller is configured to determine the mixing level for the first mixer and the second mixer by determining a sum of squares of the first audio signal and the second audio signal.

12. An audio apparatus comprising the peak current limiter of claim 1 and further comprising a power amplifier coupled to each of the at least two audio outputs.

13. A method of peak current limiting for an audio system comprising at least two audio amplifiers coupled to a respective audio input, the method comprising:
receiving an audio signal on each of the respective audio inputs;
determining a current value for each of the at least two audio amplifiers;
modifying an audio characteristic of at least one of the received audio signals to limit the total current supplied to the at least two amplifiers below a predefined maximum current value, wherein modifying the audio characteristic comprises at least one of varying an amplitude and a phase of at least one of the received audio signals,
the method further comprising varying the amplitude by applying a gain factor to at least one of the received audio signals determined from a square root of a ratio of a sum of the current values and the predefined maximum current value.

14. The method of claim 13 wherein the gain factor is related to an inverse of the ratio.

15. The method of claim 13 further comprising receiving a first audio signal on a first audio input, receiving a second audio signal on a second audio input, varying the phase of at least one of the first audio signal and the second audio signal such that a difference in phase between the first audio signal and the second audio signal is approximately 90 degrees.

16. The method of claim 13 wherein the maximum current value be predetermined and fixed or estimated from a current measurement of the circuitry excluding the power amplifiers or audio amplifiers and the maximum power available from the power source.

17. The method of claim 13 wherein if the total current exceeds the maximum available current, at least one audio characteristic of at least one of the audio signals be modified in order to limit a current consumption below the maximum current value, and the audio characteristic is the amplitude or phase.

18. A method of peak current limiting for an audio system comprising at least two audio amplifiers coupled to a respective audio input, the method comprising:

receiving an audio signal on each of the respective audio inputs;

determining a current value for each of the at least two audio amplifiers;

modifying an audio characteristic of at least one of the received audio signals to limit a total current supplied to the at least two amplifiers below a predefined maximum current value;

the method further comprising:

receiving the at least two audio signals on a respective audio input and output the processed audio signals on the respective audio output;

determining a first current and a second current value corresponding to a current in the first and second audio amplifiers; and in response to a sum of the first current value and the second current value exceeding a predefined maximum to modify an audio characteristic of at least one of the first audio signal and the second audio signal to reduce the total current.

19. The method of claim 18 further comprising:

determining a current value for each of the at least two audio amplifiers from the respective received audio signal and a model of the respective audio amplifier.

* * * * *